United States Patent
Poplack et al.

(10) Patent No.: US 11,156,660 B1
(45) Date of Patent: Oct. 26, 2021

(54) IN-SYSTEM SCAN TEST OF ELECTRONIC DEVICES

(71) Applicant: CADENCE DESIGN SYSTEMS, INC., San Jose, CA (US)

(72) Inventors: Mitchell Poplack, San Jose, CA (US);
Xiaolei Guo, San Jose, CA (US);
Phung Truong, San Jose, CA (US);
Justin Schmelzer, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/721,448

(22) Filed: Dec. 19, 2019

(51) Int. Cl.
*G01R 31/00* (2006.01)
*G01R 31/3177* (2006.01)

(52) U.S. Cl.
CPC .............................. *G01R 31/3177* (2013.01)

(58) Field of Classification Search
None
See application file for complete search history.

(56) References Cited

U.S. PATENT DOCUMENTS

| | | | | |
|---|---|---|---|---|
| 7,496,820 | B1 * | 2/2009 | Theron | G01R 31/31813 703/15 |
| 2002/0013918 | A1 * | 1/2002 | Swoboda | G06F 11/261 714/30 |
| 2004/0250150 | A1 * | 12/2004 | Swoboda | G06F 7/38 713/330 |
| 2006/0075316 | A1 * | 4/2006 | Chindamo | G01R 31/31921 714/726 |
| 2007/0214398 | A1 * | 9/2007 | Zhang | G01R 31/318371 714/728 |
| 2009/0070577 | A1 * | 3/2009 | Tkacik | G06F 21/74 713/100 |
| 2015/0113344 | A1 * | 4/2015 | Morton | G01R 31/318558 714/727 |

OTHER PUBLICATIONS

R. Cantoro, F. G. Zadegan, M. Palena, P. Pasini, E. Larsson and M. S. Reorda, "Test of Reconfigurable Modules in Scan Networks," in IEEE Transactions on Computers, vol. 67, No. 12, pp. 1806-1817, Dec. 1, 2018, doi: 10.1109/TC.2018.2834915. (Year: 2018).*

* cited by examiner

*Primary Examiner* — Daniel F. McMahon
(74) *Attorney, Agent, or Firm* — Foley & Lardner LLP

(57) ABSTRACT

A system for testing of one or more electronic devices is disclosed. In an embodiment, a processor transmits one or more test vectors to the one or more electronic devices. The one or more test vectors are based upon configuration parameters of the processor and input-output parameters of the one or more electronic devices. The processor receives scan vectors from the one or more electronic devices in response to the plurality of test vectors. The processor verifies in-system behavior of the one or more electronic devices based upon comparing received scan vectors with expected scan vectors.

20 Claims, 4 Drawing Sheets

100

200

300

400

IN-SYSTEM SCAN TEST OF ELECTRONIC DEVICES

TECHNICAL FIELD

This application is generally directed towards processor-based systems, and more specifically towards in-system scan test of electronic devices.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. A significant function of the EDA tools is emulation of a user's logical system (e.g., an IC design) to perform pre-silicon functional verification, firmware and software development, and post-silicon debug. To achieve this, a typical processor-based emulation system comprises several Application Specific Integrated Circuits (ASICs), often referred to as chips, all working together to execute a program generated by an emulation compiler generated from the user's IC design. The compiled program models a design under test (DUT) that is a logical representation of the user's IC design running on several chips of the emulation system. The compiled program may be associated with a design-level description for the IC that entails describing the IC intended behavior at a register transfer level (RTL) using a hardware description language, such as VHDL or Verilog.

The chips of the emulation system are tested for defects. This is because when any chip within the emulation system have internal defects or defects in any of its paths, such as inputs paths, output paths, or memory paths, there may be output failures. Accordingly, to prevent such output failures, the chips are tested to detect any defect using Design for Testability (DFT) logic. The DFT logic is implemented to perform tests after each chip has been synthesized, and to sort out good chips from faulty ones. Examples of the DFT logic are scan test logic, functional test logic, built-in self-test (BIST) logic, etc.

A scan test based on the scan test logic is widely used to test the chips, and detect one or more faulty chips within all the chips. The scan test is an automatic test-pattern generation (ATPG) test where test patterns are pre-generated. The scan test requires an external automated test equipment (ATE), which controls the test patterns supplied to the chips. The test patterns are stored in a tester memory, and the ATE may deliver the test patterns from the tester memory into the chips. One problem associated with the scan test is that the scan test may require insertion of supporting scan test logic, which is separate from the IC design RTL as well as other dedicated additional hardware for running, capturing, and evaluating scan vectors.

The ATE for the scan test may interface with the chips and drive all pins in a manner specified by the scan vectors. The scan test may allow internal elements of the chips to be controlled and observed where certain faults, such as stuck-at-1 or stuck-at-0 logic behavior can be detected. If a fault in a field is suspected, the chips must be removed from logic boards and rerun on the test equipment. However, due to the ever increasing complexity of today's emulation system, it is extremely difficult to remove faulty chips from the logic boards. In addition, logistics associated with retrieving the faulty chips from the logic boards are quite complex and undesirable.

One alternative technique for in-system test of the chips within the emulation system is using a BIST test that inserts embedded logic for a self-contained test. The BIST test is implemented using the BIST logic, which is embedded within the chips. During the BIST test, test patterns are generated on-chip by a BIST controller (for example, a pseudo-random pattern generator) associated with the BIST logic. Test outputs are captured on-chip by signature registers associated with the BIST logic. The signature registers compress the test results into a signature pattern that gets compared to a golden signature to check the functioning of the tested chips. As the BIST generates test patterns and evaluates test results on the chip itself, it eliminates the need for ATE memory and other equipment that accomplishes the same thing. However, the problem associated with the BIST test is that BIST test patterns are not deterministic and may miss some faults within the chips. Also, developing the BIST logic that performs exhaustive tests associated with the chips is difficult because it requires very specialized tools. Furthermore, the presence of the BIST logic adds substantial overhead to a footprint of the chips, constraints a target logic must conform to, and has an enormous impact in RTL design requirements and development schedule.

SUMMARY

What is therefore desired is in-system scan test of chips within an emulation system using existing connections between a field-programmable gate array (FPGA) and the chips within the emulation system. In a scan mode of the in-system scan test, the FPGA may be configured to apply one or more test patterns (for example, test vectors) to the chips through the existing connections between the FPGA and the chips, and may obtain output patterns (for example, output vectors) for each applied test pattern from the chips through the existing connections between the FPGA and the chips. In an offline mode, the FPGA may be configured to compare received output patterns with expected output patterns to check if the chips are functioning correctly.

What is further desired is a framework and an architecture for in-system scan test of different types of electronic devices with different functional requirements, such as a number of available pins for scan, scan target rate, electronic device input and output timing, and test vector memory size. In an in-system scan mode, a processor may be configured to transmit test vectors to the electronic devices based upon configuration parameters (e.g., a frequency) associated with the processor and input-output parameters (e.g., a number of pins) associated with the electronic devices, and may receive output vectors from the electronic devices in response to the test vectors. In an offline mode, the processor may be configured to compare received output vectors with expected output vectors to check if the electronic devices are functioning correctly.

A system (e.g., an emulation system) may include electronic devices (e.g., chips). The chips may include emulation chips, switching chips, or any other chips. The chips may be associated with each other. The chips may be interfaced with a FPGA within the emulation system. The FPGA may control one or more operations, such as power management operations associated with the chips. The FPGA may be operable as a coprocessor to execute a scan technique for in-system scan test of the chips. The FPGA may function as the coprocessor to execute the scan technique because the FPGA may include a phase locked loop (PLL) control circuit, which may support frequency and edge requirements of test vectors required for the in-system scan test of the chips. The FPGA may function as the coprocessor to execute the scan technique because the FPGA may include sufficient memory space to hold entire test vectors without host synchronization. When the scan technique for the in-system scan test of the chips is executed, a scan mode is initiated. In the scan mode of the in-system scan test, the coprocessor may obtain the test vectors from an internal memory (e.g., a first memory) associated with the FPGA and apply the test vectors to the chips through existing connections (e.g., a first connection) between the coprocessor and the chips. The coprocessor may capture output vectors for each applied test vector returned by the chips through the existing connections (e.g., a second connection) between the coprocessor and the chips, and store received output vectors in another internal memory (e.g., a second memory) associated with the FPGA. In an offline mode, the coprocessor may compare the received output vectors with expected output vectors to check if the chips are functioning correctly.

In an embodiment, a method of testing of chips in an emulation system is disclosed. The method may include transmitting, by a coprocessor of an emulator, in-system test instructions to one or more chips in the emulator through corresponding connections between the coprocessor and the one or more chips within the emulator; receiving, by the coprocessor, output vectors transmitted by the one or more chips in response to receiving the in-system test instructions; and verifying, by the coprocessor, a correct in-system behavior of the one or more chips based upon comparing received output vectors with expected output vectors.

In another embodiment, an emulation system for testing of chips is disclosed. The emulation system may include a coprocessor of an emulator configured to transmit in-system test instructions to one or more chips in the emulator through corresponding connections between the coprocessor and the one or more chips within the emulator; receive output vector transmitted by the one or more chips in response to receiving the in-system test instructions; and verify a correct in-system behavior of the one or more chips based upon comparing received output vectors with expected output vectors.

In yet another embodiment, a method of testing of electronic devices is disclosed. The method may include transmitting, by a processor, a plurality of test vectors to one or more electronic devices, the plurality of test vectors being based upon configuration parameters of the processor and input-output parameters of the electronic devices; receiving, by the processor, corresponding scan vectors from the one or more electronic devices in response to the plurality of test vectors; and verifying, by the processor, in-system behavior of the one or more electronic devices based upon comparing the corresponding scan vectors with expected scan vectors.

In yet another embodiment, a system for testing of electronic devices is disclosed. The system may include a processor configured to transmit a plurality of test vectors to one or more electronic devices, the plurality of test vectors being based upon configuration parameters of the processor and input-output parameters of the electronic devices; receive corresponding scan vectors from the one or more electronic devices in response to the plurality of test vectors; and verify in-system behavior of the one or more electronic devices based upon comparing the corresponding scan vectors with expected scan vectors.

BRIEF DESCRIPTION OF THE DRAWINGS

The accompanying drawings constitute a part of this specification and illustrate an embodiment of the subject matter described herein.

DETAILED DESCRIPTION

Figure 1:
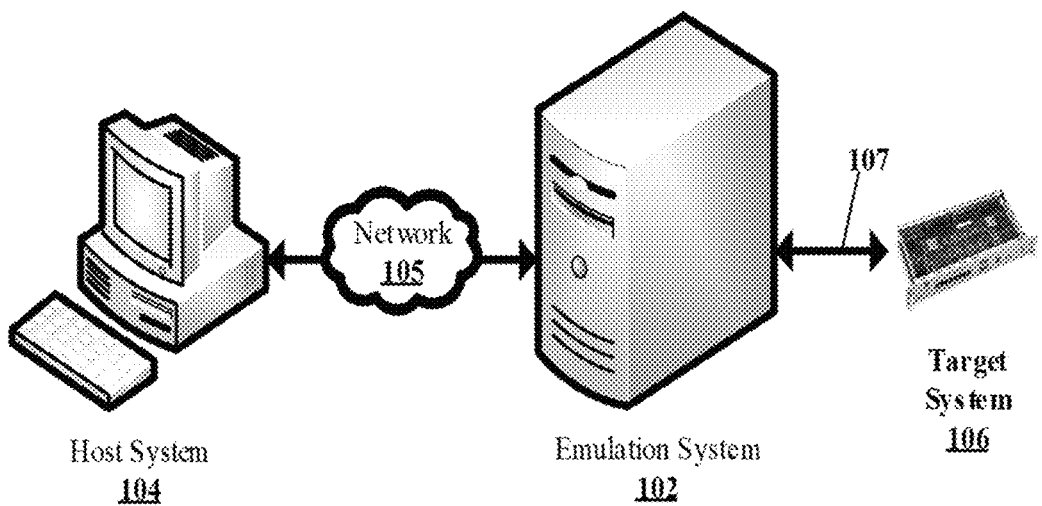
FIG. 1 shows an illustrative environment including an emulation system, according to an embodiment.

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one ordinarily skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments disclosed herein describe illustrative methods for in-system scan test of devices. The devices may be electronic devices. The electronic devices may include chips of an emulation system. The chips may be emulation chips (or emulation ASICs) that may contain a plurality of Boolean processors emulating different functions of a DUT. The chips may be switching chips (or switching ASICs) that may switch and route data between the emulation chips. In the emulation system, the chips may be directly or indirectly connected to each other. The chips may be associated with at least one FPGA within the emulation system. The FPGA may operate as a coprocessor based on its configuration (e.g., a type and specification of components and control circuits within the FPGA) and connections (e.g., pins, ports, terminals, etc. within the FPGA) with the chips for implementing certain types of in-system scan test operations. The coprocessor may use its limited number of existing connections with the chips to implement the in-system scan test of the chips in a field equivalent to scan test implemented at an ATE before emulation system assembly. The coprocessor may be able to implement the in-system scan test of the chips because the coprocessor is able to drive test vectors to the chips using the existing connections between the FPGA and the chips, capture output vectors returned by the chips using the existing connections between the FPGA and the chips, adjust timing of stimulus to closely match values specified by the test vectors using a control circuit associated with the FPGA, and compare received output vectors with reference data (e.g., expected output vectors) specified by the test vectors in an offline mode to detect any faults in the chips.

An FPGA may include or is associated with one or more components, which may enable in-system scan test of chips. The one or more components may at least include a dynamically reconfigurable PLL, an input memory, an output memory, and a host interface. The PLL may be a control circuit, which may be configured to provide and manage a scan clock signal. The PLL with dynamic reconfiguration capability may enable adjustment of one or more scan clock characteristics, such as a frequency, a phase, and a duty cycle associated with the scan clock signal to produce timing parameters specified by a waveform generation language (WGL) file, which may specify stimulus (input and output) and an external timing signal. The output memory may be configured to store driven portions of vectors (e.g., test vectors that may be transmitted from the FPGA to the chips during a scan mode). The input memory may be configured to store captured portions of vectors (e.g., output vectors that may be received by the FPGA from the chips during the scan mode). The host interface may be associated with a host workstation, which may manage data loading and/or data retrieval from the input and output memory, as well as a comparison function to offline compare received output vectors with reference data (e.g., expected output vectors) to detect faults in the chips.

An FPGA operable as a coprocessor and associated with chips may control and observe internal elements (e.g., scan chains of various elements) of the chips during in-system scan test of the chips. To scan the chips, the coprocessor may receive or generate, verify, and store a set of in-system test instructions in an output memory, which may be applied to inputs of the chips and compared against output of the chips. The coprocessor may determine a fault within the chips if an actual output generated by the chips based on the in-system test instructions does not match an expected output. A plurality of existing ports, pins, and connections between the coprocessor and the chips may be used for outputting input test data (e.g., the in-system test instructions) from the output memory within the FPGA to the chips, and receiving output data (e.g., output vectors) within an input memory of the FPGA from the chips. In a scan mode of the in-system scan test, the coprocessor may transmit the in-system test instructions to the chips through scan in pin connections between the coprocessor and the chips. The output data from the chips in response to the in-system test instructions may be captured by some elements of the chips. The output data is shifted out to the internal memory through scan out pin connections between the coprocessor and the chips. In an offline mode, the coprocessor or any other device may access these memories to obtain received output data and expected output data. The coprocessor may compare the received output data with the expected output data to check if the chips are functioning properly.

In a typical scan design for a chip under test in an emulation system, a large number of test pins may be allocated on the chip under test. The large number of test pins may be allocated on the chip under test to accelerate test time of the chip because tester time is very expensive. The chip may further be associated with a plurality of pins, which may be used for system-level functions or communication with other devices during normal operation of the chip. However, these pins may not be useful during chip-test at the ATE. The scan test of the chip may be executed using these pins. The scan test of the chip may be infrequently executed. The scan test of the chip may be executed in parallel among all boards within the emulation system. Accordingly, the scan test of the chip using these pins may be afforded more amount of time since it is rarely executed and can be executed in parallel as well. The chip may further include one or more pins, which may be connected with the FPGA. The present disclosure describes an alternate scan test mode, which may use a fewer number of pins, specifically the one or more pins that are already connected to the FPGA to execute the in-system scan test of the chip. As a result of using fewer number of pins for the in-system scan test of the chip, the scan time for the chip may be commensurately increased. In operation, during a scan mode of the in-system scan test, the FPGA may be configured to apply one or more test patterns to the chip through the one or more pins between the FPGA and the chip, and may obtain output patterns for each applied test pattern from the chip through the one or more pins between the FPGA and the chip. In an offline mode, the FPGA may be configured to compare received output patterns with expected output patterns to check if the chip is functioning correctly.

FIG. 1 shows an illustrative environment 100. The illustrative environment 100 may include an emulation system 102, a host system 104, a network 105, a target system 106, and a connection 107. The host system 104 may include one or more workstations that may run debug and runtime software interacting with the emulation system 102. The workstations may be computing devices, such as desktop computers, laptop computers, tablet computers, and smartphones.

The emulation system 102 includes a combination of hardware and software modules, which emulate a DUT. The emulation system 102 may include clusters of interconnected ASICs, FPGAs, non-transitory memory devices, buffers, data storage devices configured to provide a system platform for emulating the DUT. The clusters may be arranged in multiple logic boards. The logic boards may be arranged within multiple racks. Multiple racks may be arranged in a plurality of emulation devices, which may be analogous to multi-rack servers.

The target system 106 includes hardware modules configured to interact with the DUT being emulated. The target system 106 includes software modules configured to interact with the DUT being emulated. For example, if the DUT is a design of a graphics processing unit (GPU), the target system 106 may be a motherboard configured to receive the GPU after fabrication. The target system 106 may be an external hardware environment provided by a user.

The network 105 may be a communication link facilitating communication between the host system 104 and the emulation system 102. For example, the network 105 may include a local area network (LAN), a metropolitan area network (MAN), a wide area network (WAN), and/or Internet. The connection 107 may be a communication link configured to facilitate a communication with the emulation system 102 and the target system 106.

The above described systems 102, 104, 106 of the environment 100 are merely illustrative and other configurations should be considered to be within the scope of this disclosure. For example, the network 105 may include the connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 105 using a remote access protocol, such as internet protocol (IP).

Figure 2:
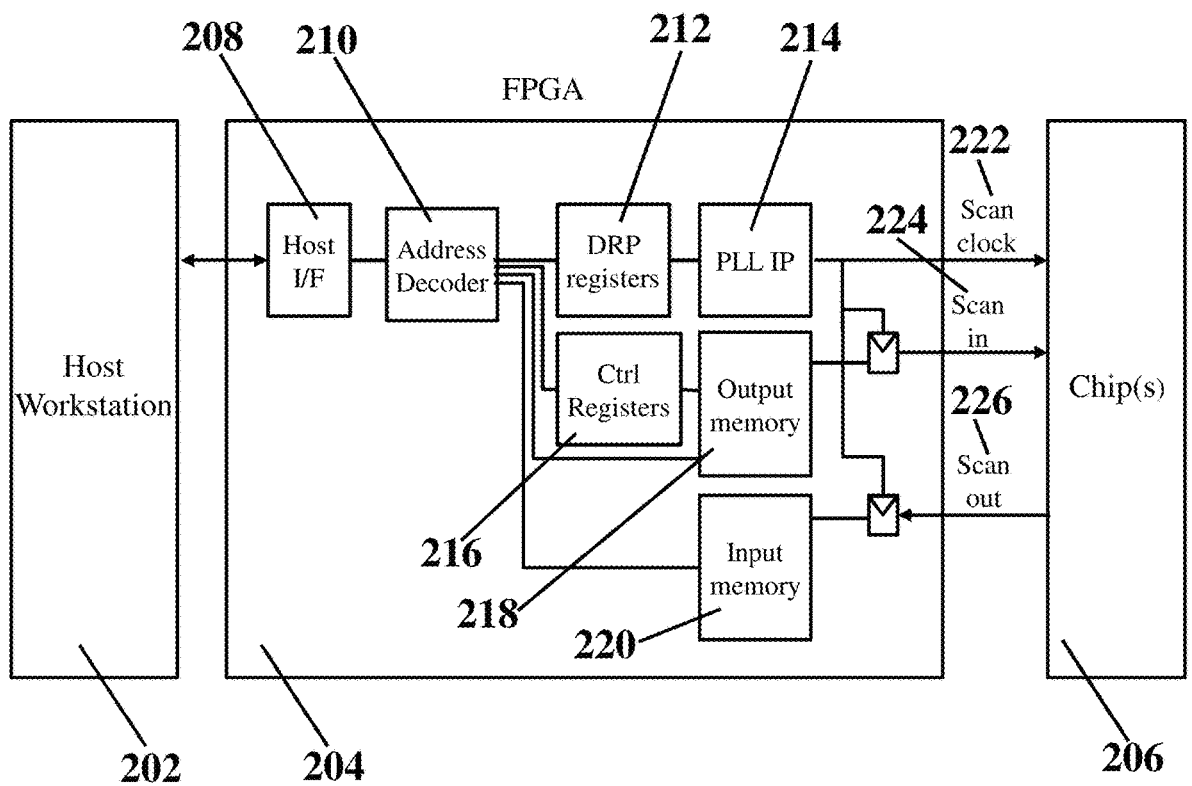
FIG. 2 shows another illustrative environment including an emulation system, according to an embodiment.

FIG. 2 shows an illustrative environment 200. The environment 200 includes a host workstation 202 and an emulation system, which may be directly or indirectly connected to each other. The emulation system include an emulator, which includes at least one FPGA 204 and at least one chip 206 associated with each other. The FPGA 204 interfaces with the chip 206 such that there are connections between the FPGA 204 and the chip 206. The FPGA 204 may be configured to implement an in-system scan test of the chip 206 in multiple modes to determine in-system behavior of the chip 206.

In operation, the FPGA 204 includes pin connection locations, which may establish electrical contact with pins of the chip 206 being tested. The FPGA 204 may assert a scan mode. In the scan mode, the FPGA 204 may input in-system test instructions to the chip 206 being tested via the pin connections between the FPGA 204 and the chip 206. The FPGA 204 may receive output vectors corresponding to the inputted in-system test instructions from the chip 206 via the pin connections between the FPGA 204 and the chip 206. The FPGA 204 may save received output vectors in association with an unique identifier of the chip 206 tested (e.g., save in an internal memory). The FPGA 204 may assert an offline mode. In the offline mode, the FPGA 204 may compare the received output vectors with expected output vectors to verify the in-system behavior of the chip 206. When the received output vectors may match with the expected output vectors, the FPGA 204 may determine that the chip 206 is functioning correctly. When the received output vectors may not match with the expected output vectors, the FPGA 204 may determine that the chip 206 has at least one fault. The FPGA 204 may produce and/or receive the in-system test instructions to apply to the chip 206 being tested from an external device or the host workstation 202, and to conduct the scan test of the chip 206 using the received in-system test instructions. The chip 206 may be associated with the FPGA 204, while specification of test inputs and processing of test results may occur elsewhere, such as at the external device or the host workstation 202.

A host workstation 202 may be a computing device, such as a desktop computer, a laptop computer, a tablet computer, and a smartphone. The host workstation 202 may execute a host software, which may provide one or more functions. The host software may be used to configure the emulator to emulate a device and to establish an initial state of the emulated device by loading values into registers, latches, or other constructs. The host software may be used to capture data (for example, emulation data, scan test data, etc.) from the emulator for purposes of evaluating and monitoring. The host software may also contain a compiler for translating a design specification for a device into a configuration specification for the emulator. The compiler may convert a hardware design, such as hardware described in VHDL or Verilog programming language to a sequence of instructions that can be evaluated by the emulator.

The host workstation 202 may include at least one central processing unit (CPU), support circuits, and a memory. The CPU may include one or more microprocessors and/or microcontrollers. The support circuits may support the operation of the CPU. The support circuits may include power supplies, clocks, input/output interface circuitry, cache, and other similar circuits. The memory may include random access memory, read only memory, disk memory, flash memory, optical storage, and/or various combinations of these types of memory. The memory may in part be used as cache memory or buffer memory. The memory may store various forms of software and files, such as an emulation support software.

The host workstation 202 may allow a user to interface with the emulator via a communication channel or an interface to control the emulation process, and collect emulation and scan test results for analysis. Under control of the host workstation 202, programming information, test instructions, and other data may be loaded to the emulator.

A emulator may be directly or indirectly connected with the host workstation 202. The emulator may include an emulation engine for performing emulation. The emulation engine may form a core element of the emulator.

The emulation engine may include a rack. The rack may be a physical housing that houses a plurality of logic boards that are organized into board clusters. In some cases, the rack may be a computing device, such as a server computer or workstation computer, configured to implement various emulation functions. The rack may physically house components, such as board clusters, logic boards, the one or more chips 206, and buses hosting data signal communications.

The board clusters may be logical and/or physical collectives of one or more logic boards. The logic boards may be clustered for any number of reasons, such as creating proximity among a set of logic boards for more efficient signal transfer and processing between the logic boards of the cluster. It should be appreciated that clustering logic boards is often a design consideration, and, as such, other embodiments may cluster and/or disaggregate logic boards according to any number of different organizational patterns. The board clusters may be interconnected with one another by buses that may carry data signals transmitted to and from the board clusters. The buses may interconnect the logic boards of a particular board cluster, so that the logic boards may transmit and receive data signals to and from other logic boards within the same board cluster.

The logic boards may include computing hardware components capable of emulation functionality to emulate the design and functions of an IC or other circuitry. The logic board may include the one or more chips 206 performing the functions used for emulation, and one or more buses interconnecting the one or more chips 206. The buses may be an optical, copper, or any other conductive material capable of carrying data signals. The buses may carry data signals transmitted to and from the one or more chips 206 of the logic board. In some cases, the logic board may include the one or more buses supporting communication between the one or more chips 206 on the same logic board and, in some cases, the logic board may include the one or more buses supporting communication between the one or more chips 206 located on other logic boards of the emulator.

The one or more chips 206 may be interconnected to each other by parallel data lanes, serial buses, or any combination of the two. The data lanes and the serial buses may be formed of any material (e.g., copper, fiber optics, gold) capable of being a medium for transmitting data signals between the one or more chips 206, or other resources of the one or more chips 206 (e.g., memories). The data lanes and the serial buses may be the medium used for transmitting a set of one or more bits (data represented by the data signals) between the chips 206 and multiplexers. After performing Boolean functions, the one or more chips 206 may produce logical results (one or more binary output bits), which the one or more chips 206 may transmit to a destination resource (e.g., memory, multiplexer) according to the instruction set or sets associated with that one or more chips 206.

The data lanes include material capable of hosting transmitted data signals between component resources of the one or more chips 206. The data lanes may be a number of parallel data lanes interconnecting components of the one or more chips 206. Such parallel data lanes may transmit a number of data signals into a single multiplexer, which may then use to execute certain logical functions according to an instruction set being performed by the multiplexer.

The serial buses are formed of a material capable of transmitting data signals from the one or more chips 206 to destinations in the emulator that are not located on the one or more chips 206, such as an external memory drive, or any other computing resource of the emulation system that is not housed on the one or more chips 206. The serial buses may be configured to convey outputted data signals in a serialized configuration. That is, data signals outputted from the one or more chips 206 may arrive at the serial bus via the parallel data lanes. These data signals may then be organized into streams of data, as opposed to the parallel data lanes, which is then transmitted over the serial bus to the appropriate destination.

The one or more chips 206 may include emulation chips (e.g., emulation ASICs) and switching chips (e.g., switching ASICs). An emulation chip may be a computational unit to perform logic computation for the purpose of emulation, simulation, and/or prototyping of logic systems and may include Boolean-processor-based-systems, or the like. One set of emulation chips may be arranged within one logic board and another set of emulation chips may be arranged within another logic board. The logic boards may be interconnected to each other through a backplane, which may provide connectors and/or slots to connect or dock the logic boards.

The emulation chips may be connected to each other through a plurality of on-board connections on the logic board. The on-board may be, for example, copper traces connecting the emulation chips to each other. Each on-board connection between a pair of emulation chips may provide multiple data lanes, etc.

The emulation chip in each logic board may be connected to at least one switching chip in other logic boards. An interconnect between the emulation chip and the switching chip may include multiple lanes to drive multiple signals into the backplane and then to the switching chips. The switching chip in each logic board may receive signals through the backplane from at least one emulation chip in other logic boards of the logic cluster and provide those signals to each emulation chip in the logic board. The switching chip may provide dynamic multiplexing and routing of data coming from the various lanes, and provide the multiplexed and routed data to the emulation chips through the interconnects.

Each chip 206 may include a plurality of elements (or other sequential devices) that are chained together. The chip 206 may include one or more scan chains where each scan chain may include one or more elements from the plurality of elements that are serially connected to each other. Two or more scan chains may include same elements.

The chip 206 may be associated with the FPGA 204 such that the FPGA 204 may load a pre-determined test pattern associated with the in-system test instructions to the chip 206 and correspondingly reads out an output pattern from the chip 206 in response to the pre-determined test pattern. The pre-determined test pattern may be inputted to the chip 206 for the in-system scan test of the chip 206. The output pattern from the chip 206 that differs from an expected pattern may indicate a presence of a defect within the chip 206.

The chip 206 may include one or more connections and lines to communicate with the FPGA 204 for the in-system scan test of the chip 206. The chip 206 may be tied to a scan clock line 222 for both functional and scan modes. The scan clock line 222 may further be associated with the FPGA 204. The input of the chip 206 may be referred to as a scan-in line 224 and it is where the in-system test instructions (for example, test patterns or test vectors) from the FPGA 204 are applied. The scan-in line 224 may further be associated with the FPGA 204. The output of the chip 206 may be referred to as a scan-out line 226 and it is where output vectors (output patterns corresponding to the inputted test patterns) are read out by the FPGA 204. The scan-out line 226 may further be associated with the FPGA 204. All of the elements within the chip 206 may be tied to the scan clock line 222. A scan-enable test control signal may be applied to the scan clock line 222 to place the elements within the chip 206 in the scan mode or state.

The elements within the chip 206 may represent a bit position. When the chip 206 is tested, the test pattern may shift one bit position per clock cycle. The clock signal may be pulsed the same number of times as the bit length of the elements within the chip 206. At the completion of this operation, the inputted test pattern (also referred to as stimulus data) may have loaded in the one or more elements of the chip 206.

The chip 206 may include pins. The pins may serve as input and output interfaces for the chip 206. There may be two or more pins associated with the chip 206. One pin may be an input pin coupled to the scan-in line 224 and another pin may be an output pin coupled to the scan-out line 226. During the scan mode of the in-system scan test of the chip 206, the in-system test instructions from the FPGA 204 may be inputted to the input pin of the chip 206 and the output of the corresponding output pin of the chip 206 may provide the output vectors to the FPGA 204.

The emulator may be associated with or include one or more programmable logic devices (PLDs), such as the FPGA 204. In one embodiment, the FPGA 204 may be incorporated within or mounted on an expansion board, for example, a personal computer expansion board such as a Peripheral Component Interconnect (PCI) board. In another embodiment, the multiple expansion boards may be included in the emulator. The FPGA 204 may be mounted on each expansion board of the multiple expansion boards.

The FPGA 204 may be associated with and communicate with the host workstation 202. The FPGA 204 may be associated with and manage the logic boards. The FPGA 204 may be associated with and communicate with the chip 206. The FPGA 204 may manage power connections associated with the chip 206. The FPGA 204 may be configured to perform the in-system scan test of the chip 206 using one or more existing limited connections between the FPGA 204 and the chip 206.

The FPGA 204 may include several components, such as a host interface (host I/F) 208, an address decoder 210, one or more dynamic reconfiguration port (DRP) registers 212, phase-locked loop (PLL) IP 214, one or more control registers 216, an output memory 218, and an input memory 220. The FPGA 204 may be configured to operate as a coprocessor based on the technical specification of its components and connections in order to implement the in-system scan test of the chip 206.

The FPGA 204 may include one or more connections and lines to communicate with the chip 206 for the in-system scan test of the chip 206. The FPGA 204 may be tied to the scan clock line 222. The scan clock line 222 may further be associated with the chip 206. The output of the FPGA 204 may be associated with the scan-in line 224 and it is where the in-system test instructions from the FPGA 204 are transmitted to the chip 206. The scan-in line 224 may further be associated with the chip 206. The input of the FPGA 204 may be associated with the scan-out line 226 and it is where the output vectors from the chip 206 are received by the FPGA 204. The scan-out line 226 may further be associated with the chip 206.

The FPGA 204 may include multiple pins. The pins may serve as input and output interfaces for the FPGA 204. There may be two or more pins associated with the FPGA 204. One pin may be an output pin coupled to the scan-in line 224 and another pin may be an input pin coupled to the scan-out line 226. During the scan mode of the in-system scan test of the chip 206, the in-system test instructions from the output memory 218 of the FPGA 204 may be outputted via the output pin and the scan-in line 224 to the chip 206 and the output vectors from the chip 206 may be received via the input pin and the scan-out line 226 in the input memory 220 of the FPGA 204.

The FPGA 204 or any other device may use a WGL, which is a data description language to generate a waveform specification expected between the FPGA 204 and the chip 206 during the in-system scan test of the chip 206. The waveform specification may describe stimulus (input and output) and timing parameters. The stimulus may be divided into one or more sequences, which may be loaded into the output memory 218. One or more scripts may parse the waveform specification to generate driven data (for example, the test patterns) that may be transmitted from the FPGA 204 to the chips 206 during the in-system scan test of the chip 206 and expected return data (for example, expected output vectors) that may be transmitted from the chips 206 to the FPGA 204 in response to the test vectors after the in-system scan test of the chip 206. The one or more scripts may further parse the waveform specification to generate timing parameters.

The output memory 218 may be programmed using the output of the one or more scripts. The output memory 218 may be loaded with the test patterns written using a scripting and/or programming language. The output memory 218 may store the in-system test instructions corresponding to the test patterns. The test patterns may be applied to the chip 206 to verify that the chip 206 is performing as expected. The output memory 218 may be directly or indirectly associated with the output pin coupled to the scan-in line 224. The output memory 218 may be a random access memory, a read only memory, a hard disk drive, a secure digital card, a magneto-resistive read/write memory, an optical read/write memory, a cache memory, or a magnetic read/write memory. The size of the output memory 218 may be dependent on a type and specification of the FPGA 204 and/or the chip 206.

The input memory 220 may include content, which may be read by the host software and other devices. The input memory 220 may store the output vectors received from the chip 206 in response to the test vectors. The input memory 220 may also store the expected output vectors to be received from the chip 206 in response to the test vectors. The input memory 220 may be directly or indirectly associated with the input pin coupled to the scan-out line 226. The input memory 220 may be a random access memory, a read only memory, a hard disk drive, a secure digital card, a magneto-resistive read/write memory, an optical read/write memory, a cache memory, or a magnetic read/write memory. The size of the input memory 220 may be dependent on the type and the specification of the FPGA 204 and/or the chip 206.

The DRP registers 212 may be programmed using the output of the one or more scripts. Information associated with the DRP registers 212 may be used to control the PLL IP 214. The information associated with the DRP registers 212 may be used to change the PLL IP 214. The information associated with the DRP registers 212 may be used to perform reconfiguration of the PLL IP 214. The DRP registers 212 may provide access to configuration bits that would be initialized in a bitstream. This allows the user to dynamically change the PLL IP 214 scan clock outputs without loading a new bitstream. The PLL IP 214 may be held in reset during dynamic reconfiguration or may be reset after the dynamic reconfiguration changes have been completed. The information associated with the DRP registers 212 may be used to change frequency, phase, and duty cycle of the scan clock signal via the PLL IP 214. In some embodiments, sample code, based on initial bring-up and debug, may be used for changing the scan clock signal frequency and edge positions for all the scan clock signals.

The PLL IP 214 is an electronic circuit that receives an input signal from the DRP registers 212 and utilizes an oscillator to generate an output signal that has the same phase as the input signal. The PLL IP 214 may detect the difference between the phase or frequency of two different signals and uses it to adjust the phase of the signal it transmits. In one embodiment, the PLL IP 214 may be used to generate and transmit the scan clock signal. The PLL IP 214 may generate the scan clock signal based on inputs received from the DRP registers 212, such as the timing parameters specified within the waveform specification. The PLL IP 214 may change the frequency, the phase, and the duty cycle of the scan clock signal based on the information within the DRP registers 212. The clock outputs from the PLL IP 214 may correspond to scan test inputs to the chip 206, the scan clock signal, and scan test outputs from the chip 206.

The control registers 216 may be programmed with a length of the test pattern. In one non-limiting example, the length of the test pattern is less than 32. The control registers 216 may further be programmed with a target instance of the chip 206. In one non-limiting example, the target instance of the chip 206 may be 0-7 or 0-37 and it may depend on a type of the logic board associated with the chip 206. The control registers 216 may further be programmed with a particular bit that may start a read out of the test pattern.

The host I/F 208 may be associated with the host software. The host software may be used to monitor operations within the FPGA 204. The host software may wait until the test pattern is finished, which may be indicated by a particular bit in the control registers 216. When the test pattern is finished, the host software may read the content from the input memory 220. The content may include the received output vectors from the chip 206. The content may further include the expected output vectors from the chip 206. The host software may compare the received output vectors and the expected output vectors when the system is in an offline mode to verify the in-system behavior of the chip 206. When the received output vectors may match with the expected output vectors, the chip 206 may be functioning correctly. When the received output vectors may not match with the expected output vectors, the chip 206 may have some defect.

The address decoder 210 is associated with the one or more DRP registers 212, the one or more control registers 216, the output memory 218, and the input memory 220. When an address for a particular device associated with the address decoder 210 appears on address inputs of the address decoder 210, the address decoder 210 asserts a selection output for that device.

Figure 3:
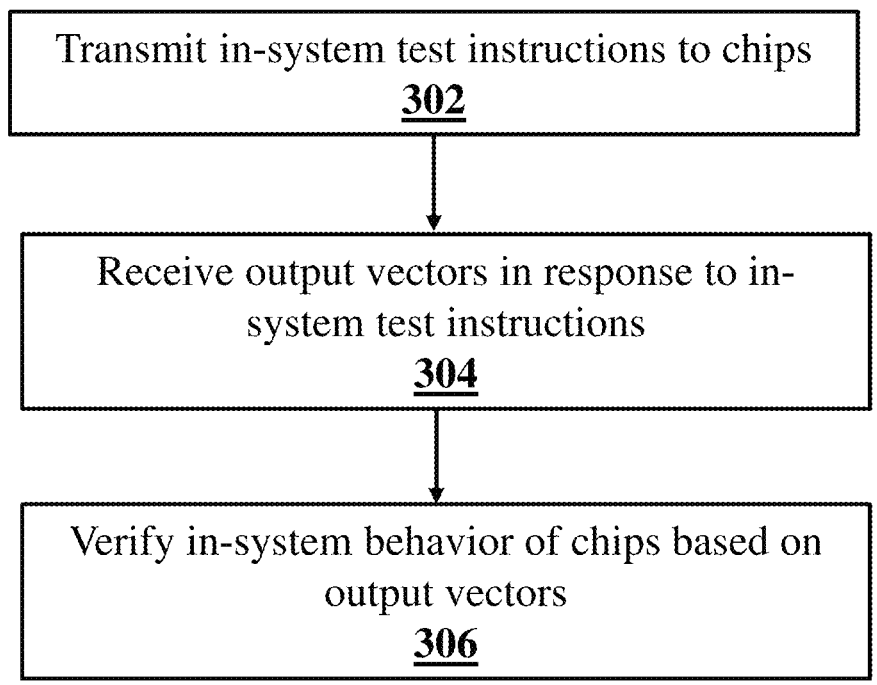
FIG. 3 is a flow diagram of a method of testing of chips in an emulation system, according to an embodiment.

FIG. 3 shows execution steps for testing of chips in an emulation system, according to a method 300. The method 300 may include execution steps 302, 304, and 306. It should be understood that the steps described herein are merely illustrative and additional or substitute steps should also be considered to be within the scope of this disclosure. Furthermore, methods with a fewer numbers of steps should also be considered to be within the scope of this disclosure.

At step 302, a coprocessor of an emulator asserts a scan mode and transmit in-system test instructions to one or more chips in the emulator. The coprocessor may transmit the in-system test instructions to the one or more chips through one or more connections and terminals between the coprocessor and the one or more chips. The one or more connections may include one or more input pins and one or more output pins of the coprocessor and the one or more chips. The input pins and the output pins may be associated with a scan-in line and a scan-out line.

The coprocessor may be associated with an output memory, which is configured to store the in-system test instructions. In the scan mode, the coprocessor may obtain the in-system test instructions from the output memory and then transmit the in-system test instructions to the one or more chips via the connections between the coprocessor and the one or more chips. The coprocessor may be a field programmable gate array. The one or more chips may include at least one emulation chip. The one or more chips may include at least one switching chip.

At step 304, the coprocessor receives or captures output vectors transmitted by the one or more chips, in response to receiving the in-system test instructions during the scan mode, via the connections between the coprocessor and the one or more chips. The coprocessor may be associated with an input memory, and the coprocessor may store received output vectors in the input memory.

At step 306, the coprocessor verifies a correct in-system behavior of the one or more chips based upon comparing expected output vectors with the received output vectors. The coprocessor may perform offline comparison of the expected output vectors with the received output vectors. When the received output vectors may not match with the expected output vectors, the coprocessor may determine at least one faulty chip within the one or more chips. When the received output vectors may match with the expected output vectors, the coprocessor may determine no defect within the one or more chips.

Figure 4:
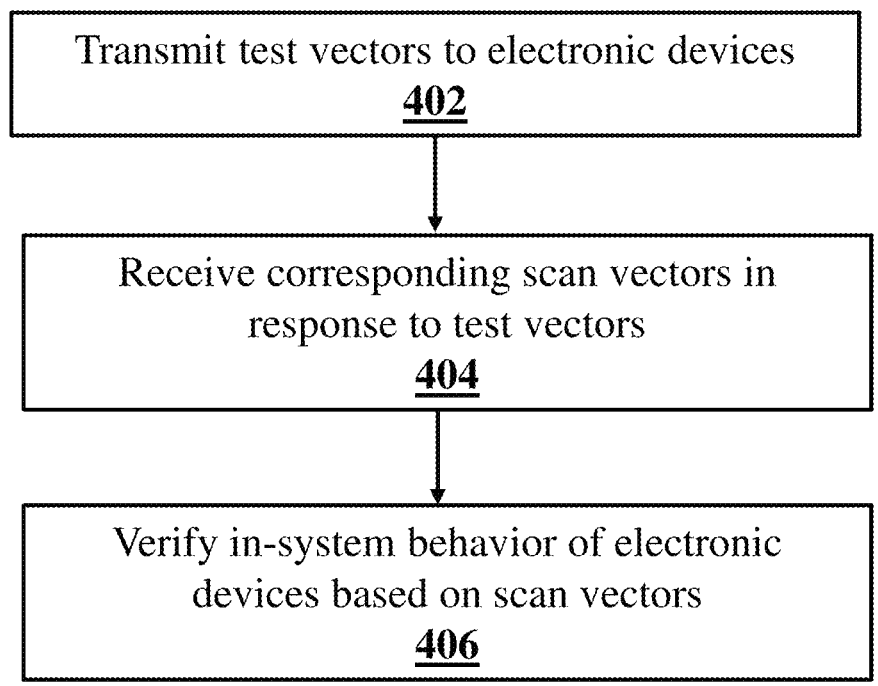
FIG. 4 is a flow diagram of a method of testing of electronic devices, according to an embodiment.

FIG. 4 shows execution steps for testing of electronic devices, according to a method 400. The method 400 may include execution steps 402, 404, and 406. It should be understood that the steps described herein are merely illustrative and additional or substitute steps should also be considered to be within the scope of this disclosure. Furthermore, methods with a fewer numbers of steps should also be considered to be within the scope of this disclosure.

At step 402, a processor asserts a scan mode and transmit a plurality of test vectors to one or more electronic devices. The plurality of test vectors may be based upon configuration parameters of the processor. The configuration parameters of the processor may include a frequency of the processor. The plurality of test vectors may be based upon input-output parameters of the electronic devices. The input-output parameters of the electronic devices may include a number of pins available in the electronic devices for scan. The plurality of test vectors may be selected based upon memory size of the test vectors. The plurality of test vectors may be selected based upon scan target rate.

The electronic devices may include emulation chips, switching chips, or any other type of electronic device. The processor may include logic, circuitry, and interfaces that are operable to execute one or more instructions to perform predetermined operations, such as in-system scan test of the electronic devices. The processor may be realized through one or more processor technologies. The examples of the processor may include, but are not limited to, an x86 processor, an ARM processor, a Reduced Instruction Set Computing (RISC) processor, or a Complex Instruction Set Computing (CISC) processor. The processor may include a Graphics Processing Unit (GPU) that executes the set of instructions to perform the in-system scan test of the electronic devices.

At step 404, the processor receives corresponding scan vectors from the one or more electronic devices, in response to the plurality of test vectors during the scan mode. The processor may store received scan vectors in an internal memory associated with the processor.

At step 406, the processor asserts an offline mode and verify in-system behavior of the one or more electronic devices based upon comparing the received scan vectors with expected scan vectors. When the received scan vectors may not match with the expected scan vectors, the processor may determine at least one faulty electronic device within the one or more electronic devices. When the received scan vectors may match with the expected scan vectors, the processor may determine no defect within the one or more electronic devices.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method of in-system testing of electronic devices, the method comprising:
    transmitting, by a processor, a plurality of test vectors to one or more electronic devices, the plurality of test vectors being based upon one or more configuration parameters of the processor and one or more input-output parameters of the one or more electronic devices;
    receiving, by the processor, scan vectors from the one or more electronic devices in response to the plurality of test vectors; and
    verifying, by the processor, in-system behavior of the one or more electronic devices based upon comparing the scan vectors received from the one or more electronic devices with expected scan vectors.

2. The method of claim 1, wherein at least one of the one or more configuration parameters of the processor comprises a frequency of the processor.

3. The method of claim 1, wherein at least one of the one or more input-output parameters of the one or more electronic devices comprises a number of pins available for scan.

4. The method of claim 1, further comprising determining, by the processor, at least one faulty electronic device within the one or more electronic devices when the received scan vectors does not match with the expected scan vectors.

5. The method of claim 1, further comprising determining, by the processor, no fault within the one or more electronic devices when the received scan vectors match with the expected scan vectors.

6. The method of claim 1, wherein the plurality of test vectors are transmitted to the one or more electronic devices in a scan testing mode.

7. The method of claim 6, wherein the scan vectors are received from the one or more electronic devices by the processor in the scan testing mode.

8. The method of claim 1, wherein comparison of the scan vectors received from the one or more electronic devices with the expected scan vectors is implemented in an offline mode.

9. The method of claim 1, wherein at least one of the one or more electronic devices comprises an emulation chip.

10. The method of claim 1, wherein at least one of the one or more electronic devices comprises a switching chip.

11. An emulation system for in-system testing of electronic devices, the emulation system comprising a processor configured to:
    transmit a plurality of test vectors to one or more electronic devices, the plurality of test vectors being based upon one or more configuration parameters of the processor and one or more input-output parameters of the one or more electronic devices;
    receive scan vectors from the one or more electronic devices in response to the plurality of test vectors; and
    verify in-system behavior of the one or more electronic devices based upon comparing the scan vectors received from the one or more electronic devices with expected scan vectors.

12. The emulation system of claim 11, wherein at least one of the one or more configuration parameters of the processor comprises a frequency of the processor.

13. The emulation system of claim 11, wherein at least one of the one or more input-output parameters of the one or more electronic devices comprises a number of pins available for scan.

14. The emulation system of claim 11, wherein the processor is further configured to determine at least one faulty electronic device within the one or more electronic devices when the received scan vectors does not match with the expected scan vectors.

15. The emulation system of claim 11, wherein the processor is further configured to determine no fault within the one or more electronic devices when the received scan vectors match with the expected scan vectors.

16. The emulation system of claim 11, wherein the plurality of test vectors are transmitted to the one or more electronic devices in a scan testing mode.

17. The emulation system of claim 16, wherein the scan vectors are received from the one or more electronic devices by the processor in the scan testing mode.

18. The emulation system of claim 11, wherein comparison of the scan vectors received from the one or more electronic devices with the expected scan vectors is implemented in an offline mode.

19. The emulation system of claim 11, wherein at least one of the one or more electronic devices comprises an emulation chip.

20. The emulation system of claim 11, wherein at least one of the one or more electronic devices comprises a switching chip.

\* \* \* \* \*